(12) United States Patent
Dubin et al.

(10) Patent No.: US 7,847,394 B2
(45) Date of Patent: Dec. 7, 2010

(54) PACKAGING OF INTEGRATED CIRCUITS WITH CARBON NANOTUBE ARRAYS TO ENHANCE HEAT DISSIPATION THROUGH A THERMAL INTERFACE

(75) Inventors: Valery M Dubin, Portland, OR (US); Thomas S. Dory, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 98 days.

(21) Appl. No.: 11/313,362

(22) Filed: Dec. 20, 2005

(65) Prior Publication Data

US 2006/0222852 A1 Oct. 5, 2006

Related U.S. Application Data

(62) Division of application No. 10/357,927, filed on Feb. 3, 2003, now Pat. No. 7,316,061.

(51) Int. Cl.
*H01L 23/10* (2006.01)
*H01L 23/34* (2006.01)

(52) U.S. Cl. .................. 257/706; 257/712; 257/720; 257/713; 257/778; 257/796; 361/687; 361/709; 361/683; 361/708; 361/713; 165/185; 165/104.33; 165/80.3

(58) Field of Classification Search .......... 257/712, 257/706, 720, 722, 778, 796, 713; 361/687, 361/713, 709, 708, 683; 165/185, 104.33, 165/80.3
See application file for complete search history.

(56) References Cited

U.S. PATENT DOCUMENTS 5,102,824 A 4/1992 Neugebauer et al.
(Continued)

FOREIGN PATENT DOCUMENTS

EP 0 538 798 4/1993
(Continued)

OTHER PUBLICATIONS

Chen, J.H. et al., "Exploratory Research on Carbon Nanotube Arrays as Nanoelectrodes for Use in Electrochemistry", Proceedings of the 199.sup.th Meeting of Electrochemical Society, Washington DC, USA, Mar. 2001, pp. 1-4.
Teo, K. B. K. et al., "Uniform Patterned Growth of Carbon Nanotubes without Surface Carbon", Applied Physics Letters, 2001 American Institute of Physics, vol. 79, No. 10, Sep. 2001, pp. 1534-1536.
(Continued)

*Primary Examiner*—Kenneth A Parker
*Assistant Examiner*—Joseph Nguyen
(74) *Attorney, Agent, or Firm*—Blakely, Sokoloff, Taylor & Zafman LLP

(57) ABSTRACT

According to one aspect of the invention, a method of constructing an electronic assembly is provided. A layer of metal is formed on a backside of a semiconductor wafer having integrated formed thereon. Then, a porous layer is formed on the metal layer. A barrier layer of the porous layer at the bottom of the pores is thinned down. Then, a catalyst is deposited at the bottom of the pores. Carbon nanotubes are then grown in the pores. Another layer of metal is then formed over the porous layer and the carbon nanotubes. The semiconductor wafer is then separated into microelectronic dies. The dies are bonded to a semiconductor substrate, a heat spreader is placed on top of the die, and a semiconductor package resulting from such assembly is sealed. A thermal interface is formed on the top of the heat spreader. Then a heat sink is placed on top of the thermal interface.

7 Claims, 9 Drawing Sheets

U.S. PATENT DOCUMENTS

| | | | |
|---|---|---|---|
| 5,316,080 | A | 5/1994 | Banks et al. |
| 5,604,037 | A | 2/1997 | Ting et al. |
| 5,780,101 | A | 7/1998 | Nolan et al. |
| 5,825,624 | A | 10/1998 | Arnold et al. |
| 5,837,081 | A | 11/1998 | Ting et al. |
| 5,965,267 | A | 10/1999 | Nolan et al. |
| 5,972,265 | A | 10/1999 | Marra et al. |
| 6,129,901 | A * | 10/2000 | Moskovits et al. ....... 423/447.3 |
| 6,156,256 | A | 12/2000 | Kennel |
| 6,232,706 | B1 | 5/2001 | Dai et al. |
| 6,283,812 | B1 | 9/2001 | Jin et al. |
| 6,303,094 | B1 | 10/2001 | Kusunoki et al. |
| 6,312,303 | B1 | 11/2001 | Yaniv et al. |
| 6,325,909 | B1 | 12/2001 | Li et al. |
| 6,350,488 | B1 | 2/2002 | Lee et al. |
| 6,361,861 | B2 | 3/2002 | Gao et al. |
| 6,383,923 | B1 | 5/2002 | Brown et al. |
| 6,407,922 | B1 | 6/2002 | Eckblad et al. |
| 6,420,293 | B1 | 7/2002 | Chang et al. |
| 6,440,761 | B1 | 8/2002 | Choi |
| 6,445,006 | B1 | 9/2002 | Brandes et al. |
| 6,495,258 | B1 | 12/2002 | Chen et al. |
| 6,504,292 | B1 | 1/2003 | Choi et al. |
| 6,528,020 | B1 | 3/2003 | Dai et al. |
| 6,531,828 | B2 | 3/2003 | Yaniv et al. |
| 6,595,906 | B2 | 7/2003 | Smith |
| 6,617,682 | B1 | 9/2003 | Ma et al. |
| 6,628,053 | B1 | 9/2003 | Den et al. |
| 6,630,772 | B1 | 10/2003 | Bower et al. |
| 6,651,736 | B2 | 11/2003 | Chiu et al. |
| 6,667,548 | B2 | 12/2003 | O'Connor et al. |
| 6,705,152 | B2 | 3/2004 | Routkevitch et al. |
| 6,737,939 | B2 | 5/2004 | Hoppe et al. |
| 6,741,019 | B1 | 5/2004 | Filas et al. |
| 6,856,016 | B2 * | 2/2005 | Searls et al. ................ 257/720 |
| 6,858,521 | B2 | 2/2005 | Jin |
| 6,891,724 | B2 | 5/2005 | De Lorenzo et al. |
| 6,921,462 | B2 | 7/2005 | Montgomery et al. |
| 6,946,597 | B2 | 9/2005 | Sager et al. |
| 6,965,513 | B2 | 11/2005 | Montgomery et al. |
| 7,019,391 | B2 | 3/2006 | Tran |
| 7,112,472 | B2 | 9/2006 | Dubin |
| 7,168,484 | B2 | 1/2007 | Zhang et al. |
| 7,301,191 | B1 | 11/2007 | Tombler et al. |
| 7,316,061 | B2 | 1/2008 | Dubin et al. |
| 7,704,791 | B2 | 4/2010 | Dubin et al. |
| 2001/0009693 | A1 | 7/2001 | Lee et al. |
| 2001/0024633 | A1 | 9/2001 | Lee et al. |
| 2002/0105071 | A1 | 8/2002 | Mahajan et al. |
| 2002/0145194 | A1 | 10/2002 | O'Conner et al. |
| 2002/0158331 | A1* | 10/2002 | Umehara et al. ............ 257/712 |
| 2002/0172767 | A1 | 11/2002 | Grigorian et al. |
| 2002/0197752 | A1 | 12/2002 | Choi |
| 2003/0064169 | A1 | 4/2003 | Hong et al. |
| 2003/0117770 | A1* | 6/2003 | Montgomery et al. ....... 361/687 |
| 2003/0135971 | A1 | 7/2003 | Liberman et al. |
| 2003/0143398 | A1 | 7/2003 | Ohki et al. |
| 2003/0179559 | A1 | 9/2003 | Engelhardt et al. |
| 2003/0231471 | A1 | 12/2003 | De Lorenzo et al. |
| 2004/0005736 | A1 | 1/2004 | Searls et al. |
| 2004/0097635 | A1 | 5/2004 | Fan et al. |
| 2004/0118129 | A1 | 6/2004 | Chrysler et al. |
| 2004/0137730 | A1 | 7/2004 | Kim et al. |
| 2004/0150100 | A1 | 8/2004 | Dubin et al. |
| 2004/0188829 | A1 | 9/2004 | Hu et al. |
| 2004/0265489 | A1 | 12/2004 | Dubin |
| 2004/0266065 | A1 | 12/2004 | Zhang et al. |
| 2005/0276093 | A1 | 12/2005 | Harutyunyan |
| 2006/0054490 | A1 | 3/2006 | Montgomery et al. |
| 2006/0128137 | A1 | 6/2006 | Furukawa et al. |
| 2006/0231946 | A1* | 10/2006 | Pan et al. .................... 257/712 |
| 2007/0116632 | A1 | 5/2007 | Harutyunyan |
| 2007/0137697 | A1 | 6/2007 | Ohki et al. |

FOREIGN PATENT DOCUMENTS

| | | |
|---|---|---|
| EP | 0 689 244 | 12/1995 |
| EP | 1 054 036 | 4/2000 |
| EP | 1 109 218 | 6/2001 |
| KR | 10-2002-0038035 A | 5/2002 |
| WO | WO 01/30694 | 5/2001 |
| WO | WO 00/33628 | 6/2001 |
| WO | WO 01/92381 | 12/2001 |

OTHER PUBLICATIONS

Chhowalla, M. et al., "Growth Process Conditions of Vertically Aligned Carbon Nanotubes Using Plasma Enhanced Chemical Vapor Deposition" Applied Physics Letters, 2001 American Institute of Physics, vol. 90, No. 10, Nov. 2001, pp. 5308-5317.

Ducati, C. et al., "Temperature Selective Growth of Carbon Nanotubes by Chemical Vapor Deposition", Applied Physics Letters, 2001 American Institute of Physics, vol. 92, No. 6, Sep. 2002, pp. 3299-3303.

"Growth of Carbon Nanotube", Nanomaterials Science and Engineering, Materials Science & Engineering, Rutgers University, http://mse.rutgers.edu/NMSE/cntgrowht.php, May 18, 2007.

"Nanofab Tools and Processes for Nanostructure Growth", Oxford Instruments, http://www.oxinst.com, May 18, 2007.

"Aligned Carbon Nanotube Arrays", NanoLab Aligned Carbon Nanotube Arrays, Nanotube Arrays, http://www.nano-lab.com/aligned/carbonnanotubearrays.html, May 18, 2007.

The NanoGrowth.TM. PECBD Tool for Low-Temperature Growth of Nanomaterials, CEVP Tools for Sputtering & Nanomaterial Growth, http://www.cevp.co.uk/nanogrowth.sub—pecvd.htm, May 18, 2007.

RF-PECVD of Carbon Nanotube, EDM Group: Research—Nanotubes—RF-PECVD Growth, Department of Engineering, http://www-g.eng.cam.ac.uk/edm/research/nanotubes/rfpecvd.html, May 18, 2007.

Carbon Solutions Inc., http:/www.carbonsolutiond.com, May 18, 2007.

R.J. Beller, et al, "High Conduction Thermal Interface Material," IBM Technical Disclosure Bulletin, vol. 36, No. 10, pp. 581-583 (Oct. 1, 1993).

Zhang, Y. , et al., "Formation of metal nanowires on suspended single-walled carbon nanotubes", Applied Physics Letters, 77(19), (Nov. 6, 2000), 3015-3017.

Andrews, R., "Nanotube Composite Carbon Fibers", Applied Physics Letters, 75, (Aug. 30, 1999), 1329-1331.

J. Li, et al., "Highly-Ordered Carbon Nanotube Arrays for Electronics Applications," Applied Physics Letters, vol. 75, No. 3, pp. 367-369 (Jul. 19, 1999).

B.Q. Wei, et al., "Organized Assembly of Carbon Nanotubes," Nature, vol. 416, Macmillan Magazines Ltd., pp. 495-496 (Apr. 4, 2002).

C. Papadopoulos, et al., "Electronic Transport in Y-Junction Carbon Nanotubes," Physical Review Letters, vol. 85, No. 16, The American Physical Society, pp. 3476-3479 (Oct. 16, 2000).

J. Li, et al., "Growing Y-Junction Carbon Nanotubes," Nature, vol. 402, Macmillan Magazines Ltd., pp. 253-254 (Nov. 18, 1999).

P. Avouris, et al., "Carbon Nanotube Electronics," Abstract No. 52, Philadelphia meeting abstracts vol. 2002-1, 201st Meeting of The Electrochemical Society, Philadelphia, PA, 3 pgs. (May 2002).

Z.J. Zhang, et al., "Substrate-Site Selective Growth of Aligned Carbon Nanotubes," Applied Physics Letters, vol. 77, No. 23, American Institute of Physics, pp. 3764-3766 (Dec. 4, 2000).

C. Bower, et al., "Plasma-Induced Alignment of Carbon Nanotubes," Applied Physics Letters, vol. 77, No. 6, American Institute of Physics, pp, 830-832 (Aug. 7, 2000).

S. Fan, et al., "Self-Oriented Regular Arrays of Carbon Nanotubes and Their Field Emission Properties," Science, vol. 283, pp. 512-514 (Jan. 22, 1999).

Liu, et al., "Fullerene Pipes", Science, vol. 280, May 22, 1998, pp. 1253-1256.

* cited by examiner

PACKAGING OF INTEGRATED CIRCUITS WITH CARBON NANOTUBE ARRAYS TO ENHANCE HEAT DISSIPATION THROUGH A THERMAL INTERFACE

This is a Divisional application of Ser. No.: 10/357,927 filed Feb. 3, 2003, now U.S. Pat. No. 7,316,061.

BACKGROUND OF THE INVENTION

1). Field of the Invention

This invention relates to a method of constructing an electronic assembly and to an electronic assembly which may be made according to the method of the invention.

2). Discussion of Related Art

Integrated circuits are formed on semiconductor wafers. The wafers are then sawed into semiconductor chips also known as microelectronic dies. Each semiconductor chip is then mounted to a package substrate. An integrated circuit within the semiconductor chip can be powered up and data signals can be sent to and received from the integrated circuit via the package substrate.

When the integrated circuit is powered up, heat is generated on the semiconductor chip which could cause destruction of the integrated circuit if the heat is not transferred away. A thermally conductive plate, such as a heat spreader or a heat sink, is often located next to the semiconductor chip. A thermally conductive grease may be located between the semiconductor chip and the thermally conductive plate. The thermally conductive grease contacts the semiconductor chip and the thermally conductive plate on opposing sides and acts as a thermal interface between the semiconductor chip and the thermally conductive plate. Heat can then be transferred from the semiconductor chip through the grease to the thermally conductive plate, from where heat can be transferred to a heat sink or other device and can be convected into the ambient.

The use of grease as a thermal couple is often unsuitable for high power applications. A thermally conductive grease has a relatively low thermal conductivity and thus provides a substantial thermal barrier for heat transferring from the die to the thermally conductive plate. As a result, an insufficient amount of heat is transferred to the heat spreader or heat sink when a large amount of heat is generated on the semiconductor chip.

BRIEF DESCRIPTION OF THE DRAWINGS

The invention is described by way of examples with reference to the accompanying drawings, wherein.

DETAILED DESCRIPTION OF THE INVENTION

FIG. 1 to FIG. 11 of the accompanying drawings illustrate a method of constructing an electronic assembly. A layer of metal is formed on a backside of a semiconductor wafer having integrated formed thereon. Then, a porous layer is formed on the metal layer. A barrier layer of the porous layer at the bottom of the pores is thinned down. Then, a catalyst is deposited at the bottom of the pores. Carbon nanotubes are then grown in the pores. Another layer of metal is then formed over the porous layer and the carbon nanotubes. The semiconductor wafer is then separated into microelectronic dies. The dies are bonded to a semiconductor substrate, a heat spreader is placed on top of the die, and a semiconductor package resulting from such assembly is sealed. A thermal interface is formed on the top of the heat spreader. Then a heat sink is placed on top of the thermal interface.

Figure 1:
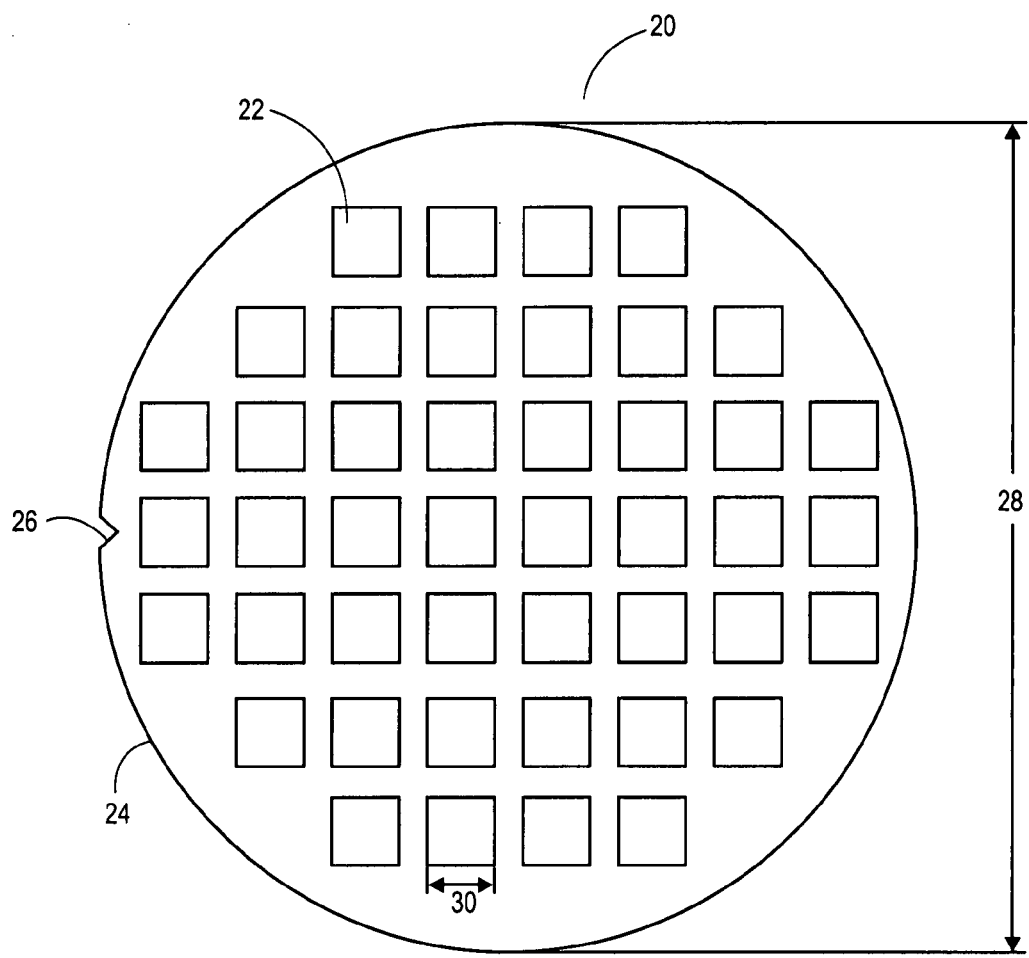
FIG. 1 is a top plan view of a semiconductor wafer including a plurality of integrated circuits formed thereon.
Figure 2:
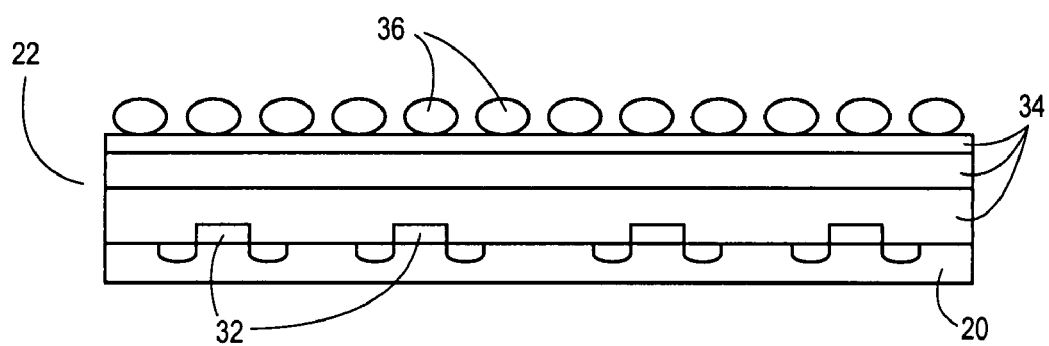
FIG. 2 is a cross-sectional side view of an integrated circuit formed on the wafer.

FIG. 1 illustrates a typical silicon semiconductor wafer 20 on which a plurality of integrated circuits 22 have been formed. FIG. 2 illustrates a portion of the wafer 20 including one of the integrated circuits 22.

The wafer 20 is circular in shape with an outer edge 24 with an indicator 26. The wafer has a diameter 28 of, for example, of 200 mm. The indicator 26 is a notch on the outer edge 24 of the wafer 20. The wafer 20 includes a plurality of integrated circuits 22 arranged in an array of rows and columns.

The integrated circuits 22 are square with sides 30 of, for example, between 12 and 20 mm. The integrated circuits 22 include transistors 32, alternating metal and dielectric layers 34, and contacts 36. The contacts 36 have been attached to the wafer 20 on an adjacent side to the integrated circuit 22. The contacts 36 stand proud of a surface of the wafer 20.

Figure 3:
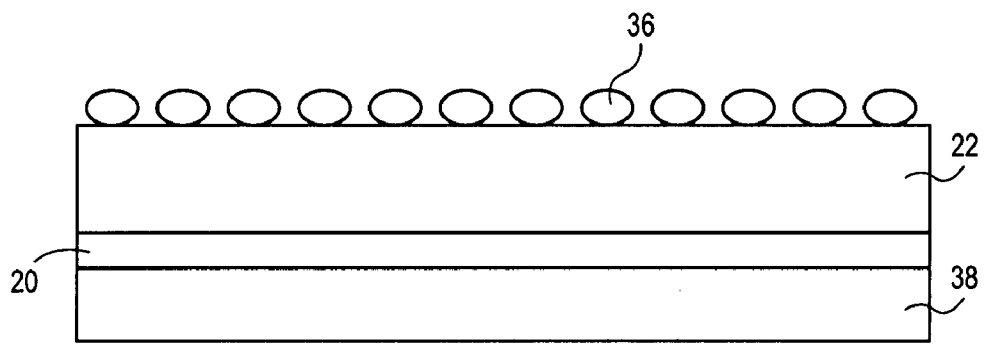
FIG. 3 is a cross-sectional side view of the integrated circuit with a layer of aluminum having been deposited.

As illustrated in FIG. 3, an aluminum layer 38 is then deposited by chemical vapor deposition onto a side of the wafer 20 opposing the integrated circuit 22. The aluminum layer 38 is on a side of the integrated circuit 22 opposing the contacts 36.

Figure 4:
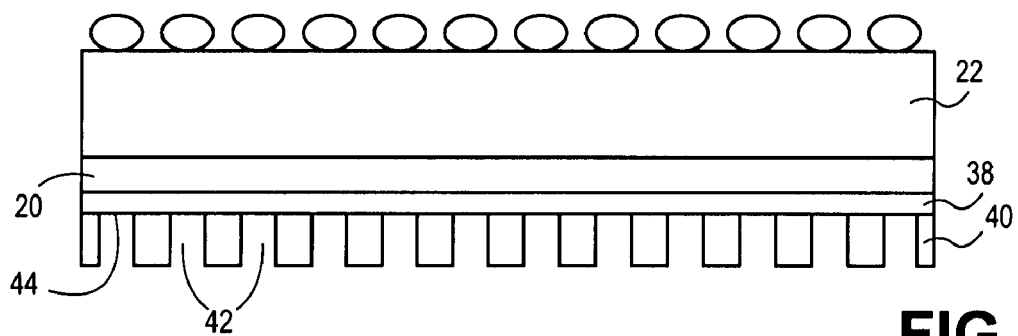
FIG. 4 is a cross-sectional side view of the integrated circuit with a porous layer of aluminum oxide formed on the layer of aluminum.

As illustrated in FIG. 4, a porous aluminum oxide layer 40 is then formed on the aluminum layer 38. The porous aluminum oxide can be formed by anodic oxidation of the aluminum layer 38 in acids such as sulfuric acid, phosphoric acid, and oxalic acid in the concentration range of 1-10% at 10-60 V. The aluminum oxide layer 40 includes a plurality of pores 42. A barrier layer of aluminum oxide has been thinned down from ends 44 of the pores 42 adjacent to the aluminum layer 38.

Figure 5:
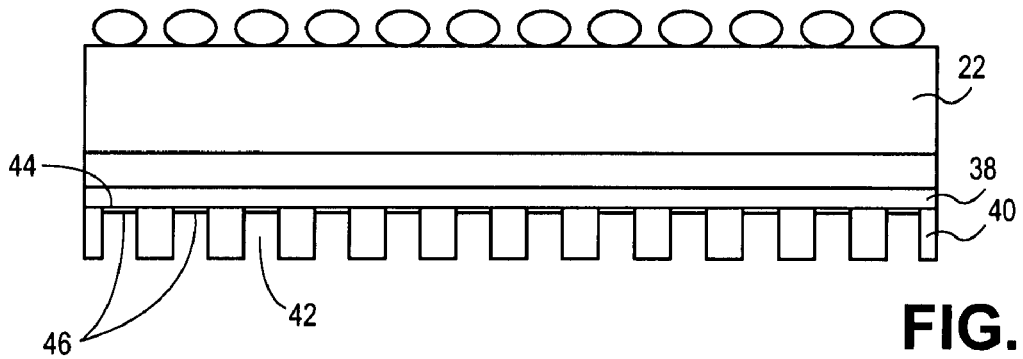
FIG. 5 is a cross-sectional side view of the integrated circuit with nickel catalysts deposited into the pores.

As illustrated in FIG. 5, nickel catalysts 46 are then selectively deposited in the pores 42 of the aluminum oxide layer 40 by cathodic deposition. The cathodic deposition can be performed by using alternating voltage. The nickel is deposited from a solution containing nickel sulfate at 10-50 g/l, boric acid at 10-50 g/l, and sulfuric acid at 2-4 g/l with a pH between 3 and 5 and a cathodic voltage between 10 and 20 V. The nickel catalysts 46 are positioned at the ends 44 of the pores 42.

Figure 6:
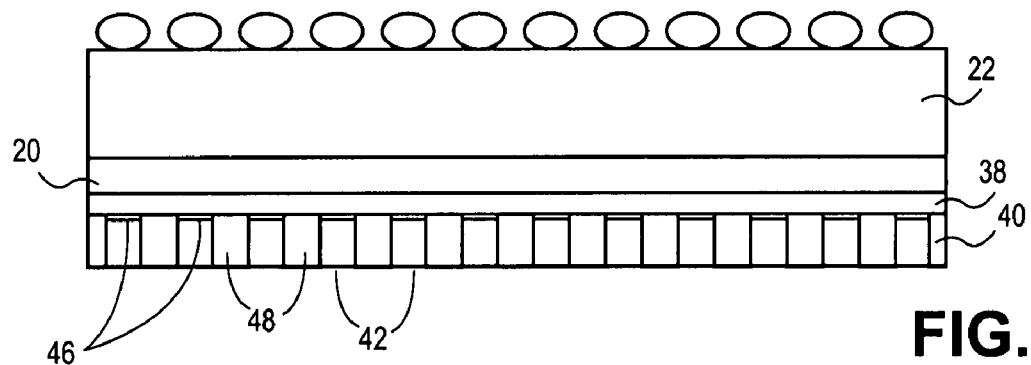
FIG. 6 is a cross-sectional side view of the integrated circuit with carbon nanotubes deposited into the pores of the aluminum oxide layer.

As illustrated in FIG. 6, carbon nanotubes 48 are then grown on the catalysts 46 inside the pores 42 by selective plasma enhanced chemical vapor deposition and completely fill the pores 42.

Figure 7:
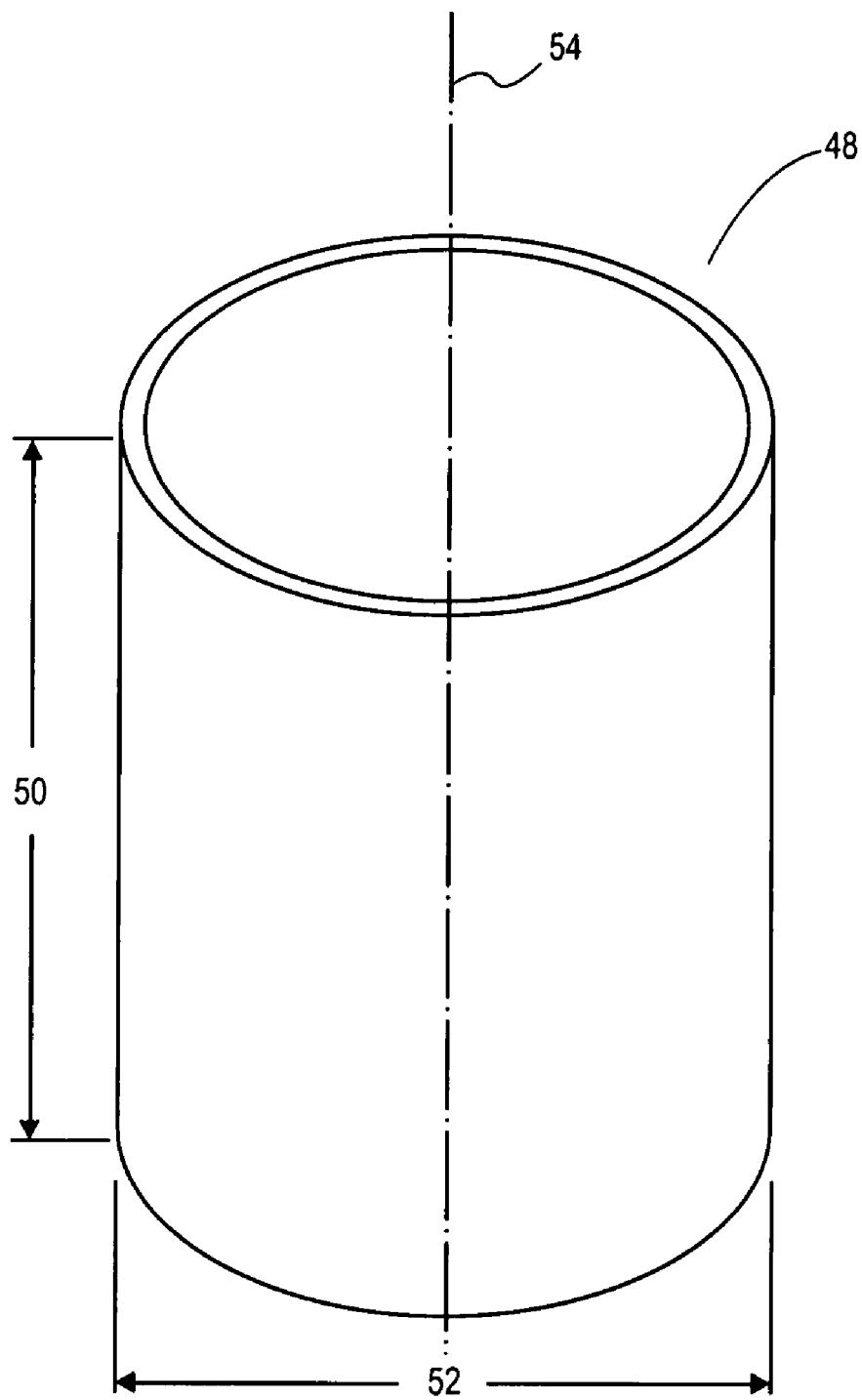
FIG. 7 is a perspective view of a carbon nanotube.

FIG. 7 illustrates one of the carbon nanotubes 48. The carbon nanotubes 48 are cylindrical in shape with a height 50 of 5 microns, a diameter 52 of 500 angstroms, and a primary axis 54. The heights are typically between 1 and 10 microns, and the diameters are typically between 10 and 1000 angstroms. The carbon nanotubes 48 are single-walled but may be multi-walled. The carbon nanotubes 48 are grown in the pores 42 such that the primary axis 54 is perpendicular to the sides of the integrated circuit 22. This is achieved by applying an electric field while growing the carbon nanotubes 48.

Figure 8:
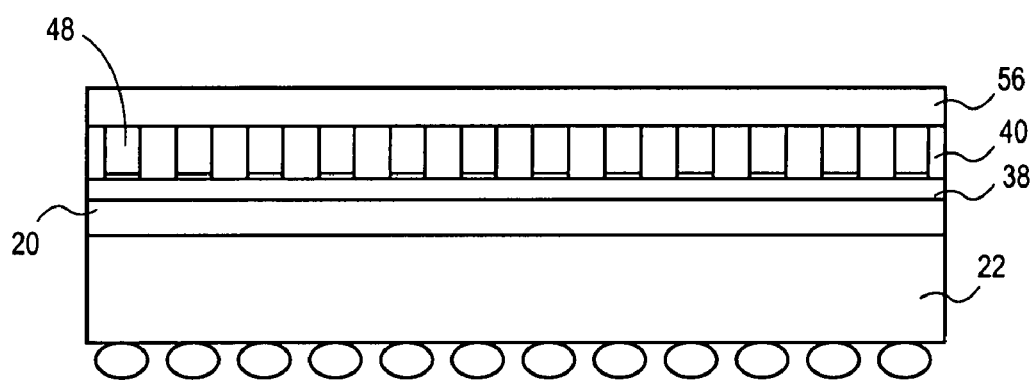
FIG. 8 is a cross-sectional side view of the integrated circuit flipped over and with a layer of indium formed on the layer of aluminum oxide.

FIG. 8 illustrates the integrated circuit 22 after the integrated circuit 22 has been flipped over and an indium layer 56 has been added onto the aluminum oxide 40 layer by chemical vapor deposition.

Figure 9:
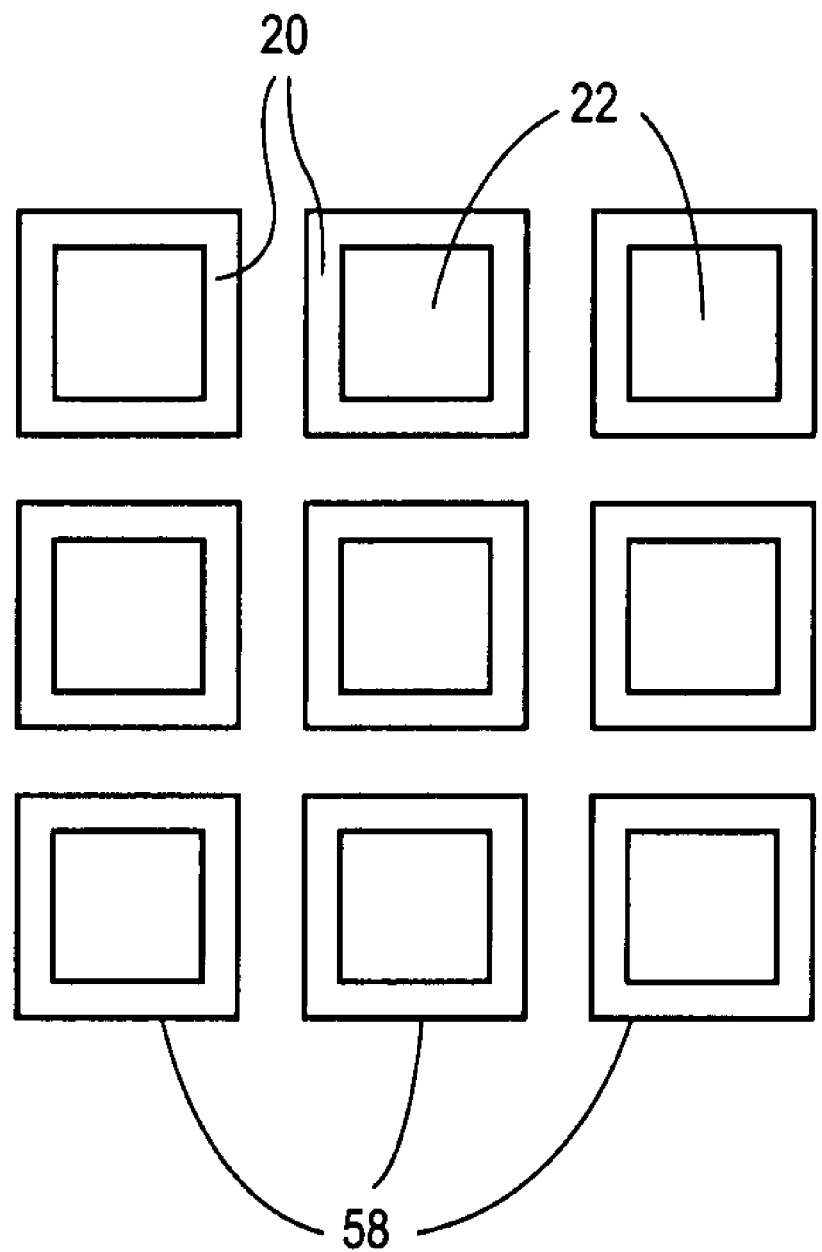
FIG. 9 is a top plan view of a portion of the semiconductor wafer with the integrated circuits separated into microelectronic dies.

As illustrated in FIG. 9, the semiconductor wafer 20 is then cut between the integrated circuits 22 to form individual singulated microelectronic dies 58.

Figure 10:
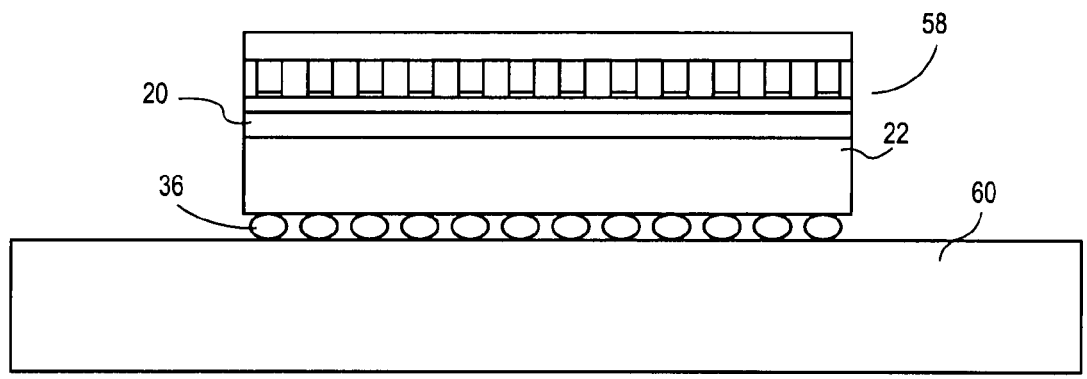
FIG. 10 is a cross-sectional side view of a microelectronic die bonded to a semiconductor substrate.

FIG. 10 illustrates one of the microelectronic dies 58 after being separated from the wafer 20. The microelectronic die 58 has been placed on top of a silicon semiconductor substrate 60. The contacts 36 have been heated to reflow and have bonded to the substrate 60.

Figure 11:
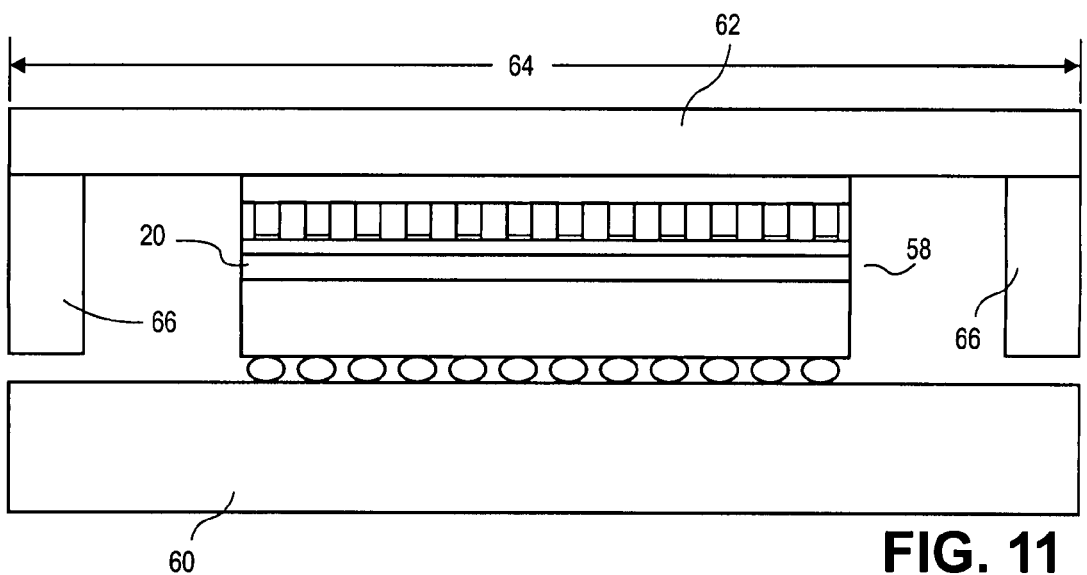
FIG. 11 is a cross-sectional side view of the microelectronic die with a heat spreader bonded to the indium layer.

As illustrated in FIG. 11, a heat spreader 62 is then positioned on top of the microelectronic die 58. The heat spreader 62 is a thermally conductive member that has a width 64 of 70 mm. Walls 66 extend downward from the heat spreader 62 but do not extend completely to the substrate 60.

Figure 12:
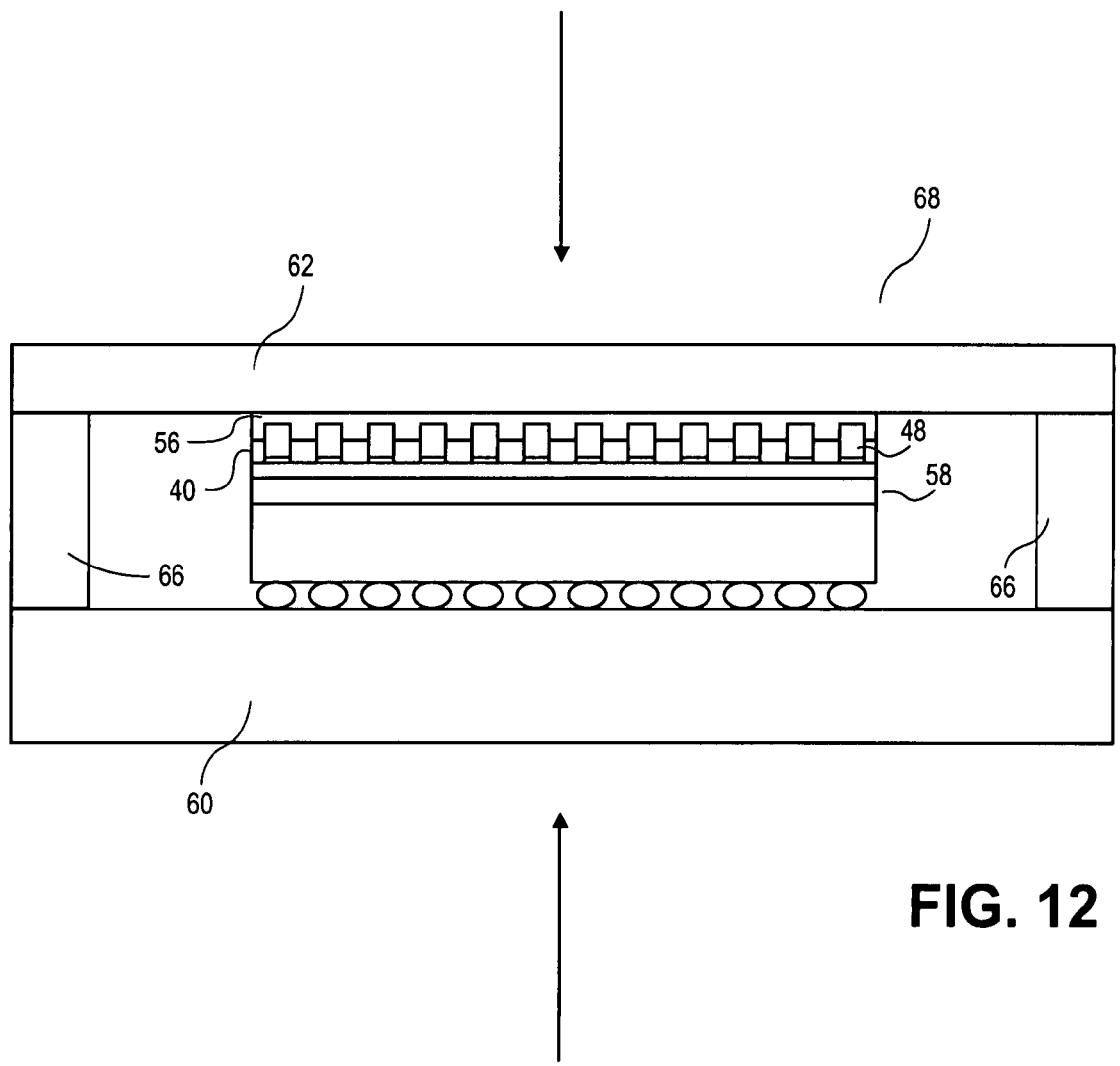
FIG. 12 is a cross-sectional side view of a semiconductor package including the microelectronic die, the semiconductor substrate, and the heat spreader.

As illustrated in FIG. 12, the microelectronic die 58 then completely enclosed within a semiconductor package 68. Heat is applied to the package 68 including the substrate 60, the microelectronic die 58, and the heat spreader 62. Pressure is applied to opposing sides of the substrate 60 and the heat spreader 62. Due to the heat, the aluminum oxide layer 40 and the indium layer 56 have become flexible and the combined thickness of the aluminum oxide layer 40 and the indium layer 42 has decreased slightly. The carbon nanotubes 48 are now embedded in the indium layer 56. Furthermore, the walls 66 of the heat spreader 62 have now moved into contact with the substrate 60 to seal the semiconductor package 68. The carbon nanotubes 48 can also be mechanically connected to the heat spreader 62.

Figure 13:
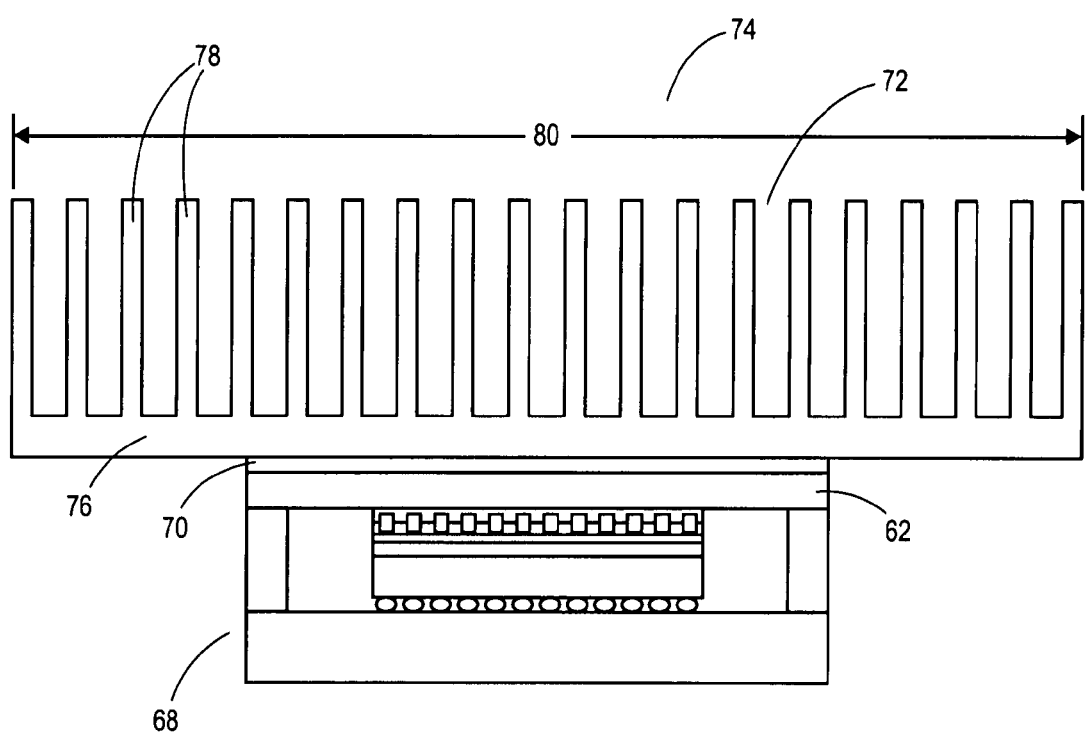
FIG. 13 is a cross-sectional side view of an electronic assembly including the semiconductor package and a heat sink.

As illustrated in FIG. 13, after the package 68 has been sealed a thermal interface 70 is added to the top of the heat spreader 62. A heat sink 72 is then placed on top of the package 68 to form a complete electronic assembly 74. The heat sink 72 is a thermally conductive member having a base portion 76 and heat sink fins 78. The heat sink 72 has a rectangular cross-section a width 80 of 140 mm.

In use, power is supplied to the integrated circuit 22. The transistors 32 begin to heat up as current conducts through a substrate that remains of the original wafer (see reference numeral 20 in FIG. 1), the aluminum layer 38, the aluminum oxide layer 40, and the carbon nanotubes 48. Due to the chemical bond between the aluminum and the carbon nanotubes 48, the heat experiences very little thermal resistance as the heat conducts between the aluminum and the carbon nanotubes 48. The carbon nanotubes 48 have an extremely high thermal conductivity and thermally couple the integrated circuit 22 to the heat spreader 62 through the aluminum and the indium layer 56. The thermal resistance is especially low in a direction of the primary axis 54 of the carbon nanotubes 48. The thermal resistance of the electronic assembly 74 is even further reduced if at least 5%, preferably 15% or more, of the aluminum oxide layer 40 is covered with the carbon nanotubes 48. The thermal resistance of the electronic assembly 74 is particularly low if the primary axes 54 of at least 20% of the carbon nanotubes 48 are parallel to each other. The combination of the chemical bond, thermal conductivity of the carbon nanotubes 48, and the orientation of the carbon nanotubes 48 provides the system a very high thermal conductivity. As a result, the heat efficiently conducts from the integrated circuit 22 to the indium layer 56.

Once through the indium layer 56, the heat is conducted to the heat spreader 62 where, due to the width 64 of the heat spreader 62, it quickly dissipates and conducts to the thermal interface 70. After conducting through the thermal interface 70, the heat conducts to the heat sink 72, another thermally conductive member with an increased width 80. The heat conducts through the base portion 76 of the heat sink 72 to the heat sink fins 78. Due to increased surface area created by the fins 78, the heat efficiently convects to the surrounding air.

One advantage is that a thermal interface with a higher thermal conductivity is provided, especially when compared with thermal greases and metallic layers. Another advantage is that the thermal interface has a high mechanical strength. A further advantage is that a chemical bond is provided between the carbon nanotubes and the integrated circuit which promotes transfer of heat. A further advantage is that an improved contact between the integrated circuit and the thermal materials is provided. A further advantage is that a thinner and more uniform thermal interface is provided.

Other embodiments of the invention may use different methods of depositing the catalysts such as electroplating or electroless plating, and different catalysts such as cobalt, iron, rhodium platinum, nickel yttrium, or any combination thereof can be used as well. Alternative techniques can be used to grow the carbon nanotubes including discharge, between carbon electrodes, laser vaporization of carbon, thermal decomposition of hydrocarbons such as acetylene, methane, ethane, and gas phase chemical vapor deposition (CVD) which uses carbon monoxide and metal carbonyls. More than one carbon nanotubes, either single or multi-walled, may be grown in individual pores. The backside metallization of the wafer can also be accomplished by plasma vapor deposition (PVD) or plating, and other metals such as copper, aluminum, nickel, cobalt, gold, germanium, gallium, rubidium, rhodium, platinum, tin, bismuth, tin lead, palladium, or combinations thereof can be used. The heat sink can also be positioned directly on the indium layer and the carbon nanotubes, and the heat spreader need not be used at all.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed:

1. An electronic assembly, comprising:
   a microelectronic die having a die substrate and an integrated circuit on the die substrate;
   a porous layer on the die substrate, the porous layer having a plurality of pores;
   a thermally conductive substrate;
   an indium layer between the porous layer and the thermally conductive substrate; and a plurality of carbon nanotubes in the plurality of pores, the plurality of carbon nanotubes thermally coupling the microelectronic die to the thermally conductive substrate, each of the carbon nanotubes having one end chemically bonded to one of the substrates.

2. The electronic assembly of claim 1, wherein the carbon nanotubes are positioned between the thermally conductive substrate and a side of the die substrate opposing the integrated circuit.

3. The electronic assembly of claim 2, wherein the thermally conductive substrate is a heat spreader which is larger than the microelectronic die.

4. An electronic assembly, comprising:
a microelectronic die comprising a die substrate and an integrated circuit, the die substrate having a side opposing the integrated circuit;
a porous layer on the die substrate, the porous layer having a plurality of pores;
a plurality of carbon nanotubes in the plurality of pores, the carbon nanotubes having first portions, second portions, and primary axes, the first portions being thermally coupled to the side of the die substrate opposing the integrated circuit, at least 20% of the primary axes being substantially parallel with one another;
a thermally conductive substrate thermally coupled to the second portions of the carbon nanotubes; and
an indium layer between the porous layer and the thermally conductive substrate, the second portions of the carbon nanotubes being embedded in the indium layer.

5. The electronic assembly of claim 4, wherein the carbon nanotubes cover at least 5% of a portion of the side of the die substrate opposing the integrated circuit with an area of at least 1 $cm^2$.

6. The electronic assembly of claim 5, wherein at least 20% of the primary axes are substantially perpendicular to the side of the die substrate opposing the integrated circuit, 7. The electronic assembly of claim 6, wherein the carbon nanotubes are grown on the side of the die substrate opposing the integrated circuit.

* * * * *